United States Patent
Kim

(10) Patent No.: US 8,878,166 B2
(45) Date of Patent: Nov. 4, 2014

(54) ORGANIC LIGHT-EMITTING DISPLAY PANEL AND DISPLAY APPARATUS HAVING THE SAME

(71) Applicant: Samsung Electronics Co., Ltd., Suwon-si (KR)

(72) Inventor: Woo-jung Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/678,190

(22) Filed: Nov. 15, 2012

(65) Prior Publication Data

US 2013/0168649 A1   Jul. 4, 2013

(30) Foreign Application Priority Data

Dec. 30, 2011  (KR) .......... 10-2011-0147459
Jan. 31, 2012   (KR) .......... 10-2012-0010035
Apr. 26, 2012   (KR) .......... 10-2012-0043881

(51) Int. Cl.
*H01L 29/08* (2006.01)
*H01L 35/24* (2006.01)
*H01L 51/00* (2006.01)
*H01L 27/32* (2006.01)
*H01L 51/52* (2006.01)
*H01L 27/28* (2006.01)

(52) U.S. Cl.
CPC ............ *H01L 27/288* (2013.01); *H01L 27/323* (2013.01); *H01L 51/524* (2013.01); *H01L 27/3227* (2013.01)

USPC .......................................................... 257/40

(58) Field of Classification Search
USPC ........ 257/40, 88, 99, 432, E33.058, 294, 787, 257/E25.021, E51.02, 686, 433, 642–643, 257/E21.503, E33.059, 759, 257/E51.001–E1.052, E25.008–E25.009; 438/29, 25, 69, 82, 99, 28; 428/41.7, 428/214, 343; 361/680, 681, 682, 679.21, 361/679.22, 679.26; 345/170; 362/800, 362/249.02, 546, 555; 445/25
See application file for complete search history.

(56) References Cited

U.S. PATENT DOCUMENTS

| | | | |
|---|---|---|---|
| 7,009,664 B2 * | 3/2006 | Imayama et al. | 349/43 |
| 2009/0138695 A1 * | 5/2009 | Jung et al. | 713/2 |
| 2009/0309845 A1 * | 12/2009 | Chen et al. | 345/173 |
| 2011/0199331 A1 * | 8/2011 | Otagaki et al. | 345/174 |
| 2011/0267284 A1 * | 11/2011 | Lee et al. | 345/173 |

* cited by examiner

*Primary Examiner* — Dao H Nguyen
*Assistant Examiner* — Tram H Nguyen
(74) *Attorney, Agent, or Firm* — Sughrue Mion, PLLC

(57) ABSTRACT

A display apparatus having an organic light emitting display panel is provided. The organic light emitting display panel includes a front substrate and a rear substrate which are arranged parallel to each other, an image forming portion which is formed on a rear surface of the front substrate and which includes at least one organic layer, a sealing member which surrounds the image forming portion between the front substrate and the rear substrate to seal the image forming portion, and an input key flexible printed circuit board (FPCB) which includes user input keys. The input key FPCB is mounted on the front substrate or the rear substrate.

23 Claims, 16 Drawing Sheets

| | |
|---|---|
| Cathode | ~48 |
| EIL | ~47 |
| ETL | ~46 |
| HBL | ~45 |
| EML | ~44 |
| HTL | ~43 |
| HIL | ~42 |
| Anode | ~41 |

| Cathode | ~48 |
| EIL | ~47 |
| ETL | ~46 |
| HBL | ~45 |
| EML | ~44 |
| HTL | ~43 |
| HIL | ~42 |
| Anode | ~41 |

ORGANIC LIGHT-EMITTING DISPLAY PANEL AND DISPLAY APPARATUS HAVING THE SAME

CROSS-REFERENCE TO RELATED APPLICATIONS

This application claims priority from Korean Patent Application No. 10-2011-0147459, filed on Dec. 30, 2011, Korean Patent Application No. 10-2012-0010035, filed on Jan. 31, 2012 and Korean Patent Application No. 10-2012-0043881, filed on Apr. 26, 2012 in the Korean Intellectual Property Office, the disclosure of which are incorporated herein in their entirety by reference.

BACKGROUND

1. Field of the Invention

Panels and apparatuses consistent with exemplary embodiments relate to organic light-emitting display panel and a display apparatus having the same.

2. Description of the Related Art

Flat-panel displays have been mainly used in recent display apparatuses such as televisions and computer monitors. Representative examples of such flat-panel displays include liquid crystal displays (LCD), plasma display panels (PDP), and organic light-emitting diode (OLED) displays.

A flat-panel display generally includes a display panel, and a front and a rear chassis surrounding the display panel. User input keys are exposed outside on the front chassis for screen and sound adjustments. An input key circuit board with the input keys mounted thereon is arranged within the front chassis. In this example, the input key circuit board is generally mounted on a structure formed integrally with the front chassis, or on a structure provided separately from the front chassis.

However, the fact that the above-mentioned conventional way of mounting an input key circuit board requires a space within the flat-panel display to accommodate the structure for mounting the input key circuit board can be an obstacle to hinder a slimmer design or bezel-less design of flat-panel display.

Among the flat-panel displays, the organic light-emitting display illuminates itself and thus provides advantages such as no need for a backlight unit, a wider view angle, a relatively fast response speed, low electricity consumption, and very thin shape.

An organic light-emitting display panel provided in the organic light-emitting display generally includes a transparent front substrate and an image forming portion stacked thereon. The image forming portion may include an anode electrode, an organic light emitting layer, or a cathode electrode, and may be sealed by the rear board to prevent oxygen or moisture ingression. While the front substrate may be entirely sealed by the rear substrate, a non-sealed portion may be present on edges thereof. The non-sealed portion may be formed to ensure a highly reliable seal.

Given the fact that the image forming portion is not formed on the non-sealed portion, a method may be provided, which utilizes the non-sealed portion of the front substrate as a place to arrange certain element(s) within the organic light-emitting display.

SUMMARY

Exemplary embodiments overcome the above disadvantages and other disadvantages not described above. Also, the exemplary embodiments are not required to overcome the disadvantages described above, and the exemplary embodiments may not overcome any of the problems described above.

According to one aspect of an exemplary embodiment, an organic light-emitting panel is provided which is suitable for a slimmer and bezel-less deemblemed design which minimizes installation space for an input key circuit board, and a display apparatus having the same.

In one exemplary embodiment, a display apparatus comprising an organic light emitting display panel is provided, in which the organic light emitting display panel includes a front substrate and a rear substrate arranged parallel to each other, an image forming portion which is formed on a rear surface of the front substrate and which comprises at least one organic layer, a sealing member which surrounds the image forming portion between the front substrate and the rear substrate to seal the image forming portion, and an input key flexible printed circuit board (FPCB) including input elements. The input key FPCB is mounted on the front substrate or on the rear substrate.

The organic light emitting display panel may additionally include a cover film to cover a front surface of the front substrate, the cover film may include a transparent portion corresponding to an effective display portion of the front substrate, and a non-transparent portion corresponding to a non-effective display portion of the front substrate.

The input key FPCB may be mounted on a front surface of the front substrate.

The input key FPCB may be arranged on the non-effective display portion of the front substrate and covered by the non-transparent portion of the cover film.

A least one of the input elements may be an illuminance sensor to automatically adjust brightness of an image in accordance with ambient intensity of illumination, the front substrate may be made of a transparent material, and the non-transparent portion of the cover film may include a light passing portion for reception of an external light by the illuminance sensor.

The input key FPCB may be mounted on a rear surface of the front substrate.

The rear surface of the front substrate may include a non-sealed region that is not surrounded by the sealing member, and the input key FPCB may be mounted on the non-sealed portion.

At least one of the input elements may be an illuminance sensor to automatically adjust brightness of an image in accordance with ambient intensity of illumination, and the non-transparent portion of the cover film may include a light passing portion for reception of an external light by the illuminance sensor.

The input key FPCB may be mounted on a rear surface of the front substrate.

The input key FPCB may also be mounted on the rear surface of the rear substrate corresponding to a non-effective display portion of the front substrate.

At least one of the input elements may be a touch sensor responsive to a touch made by a user.

The touch sensor may include a touch sensor of an electrostatic capacity type.

The rear surface of the front substrate may include a non-sealed region un-surrounded by the sealing member, and the non-sealed portion may include at least one see-through region which can be seen through the cover film from an outside.

The non-transparent portion of the cover film may include at least one light passing portion corresponding to the at least one see-through region.

The see-through region may be provided with at least one emblem for the purpose of promotion or aesthetic feeling.

The emblem may be a product logo.

The emblem may be attached in the see-through region in a form of a sticker.

The emblem may be formed in the see-through region by embossing or engraving followed by coating or coloring.

The display apparatus may additionally include an embedded camera module, and the camera module may include a lens unit arranged to face the see-through region.

In one exemplary embodiment, a display apparatus including an organic light emitting display panel is provided, in which the organic light emitting display panel includes a front substrate and a rear substrate arranged parallel to each other, an image forming portion which is formed on a rear surface of the front substrate and which includes at least one organic layer, a sealing member which surrounds the image forming portion between the front substrate and the rear substrate to seal the image forming portion, and a cover film attached to the front surface of the front substrate. The rear surface of the front substrate includes a non-sealed region un-surrounded by the sealing member, and the non-sealed region includes at least one see-through region which can be seen through from an outside through the cover film.

The see-through region may be provided with at least one emblem for the purpose of promotion or aesthetic feeling.

The emblem may be a product logo.

The display apparatus may additionally include an embedded camera module, and the camera module may include a lens unit arranged to face the see-through region.

BRIEF DESCRIPTION OF THE DRAWINGS

The above and/or other aspects of the present inventive concept will be more apparent by describing certain exemplary embodiments of the present inventive concept with reference to the accompanying drawings, in which:

FIG. 4 is a cross-section view illustrating a detailed structure of an image forming portion of the organic light-emitting display panel of FIG. 3;

FIG. 14 is a cross-section view illustrating a stacked structure of the image forming portion of the organic light-emitting display panel of FIG. 13;

DETAILED DESCRIPTION OF EXEMPLARY EMBODIMENTS

Figure 1:
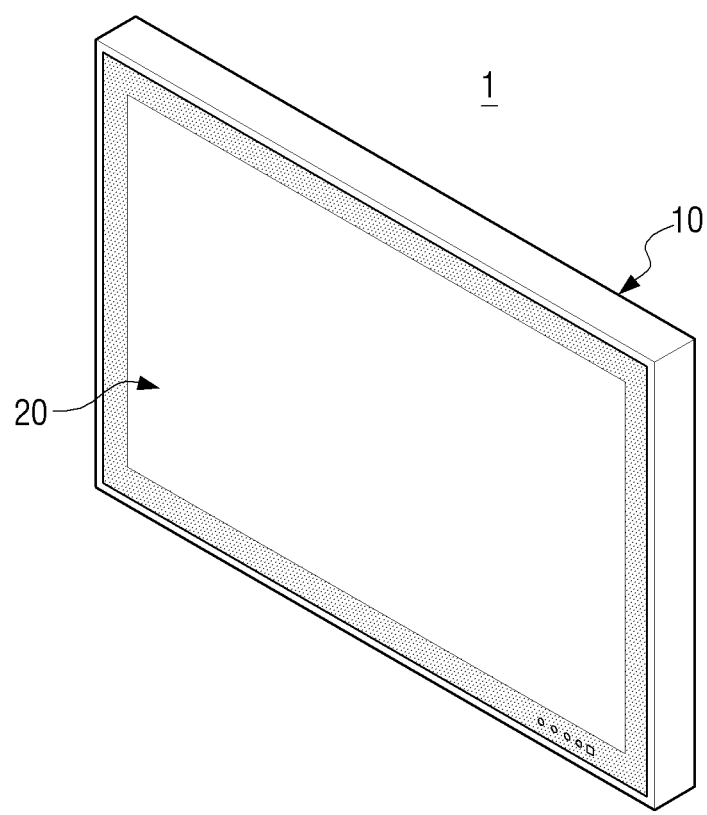
FIG. 1 is a schematic perspective view of an organic light-emitting display apparatus according to an exemplary embodiment.

Certain exemplary embodiments of the present inventive concept will now be described in more detail with reference to the accompanying drawings, in which exemplary embodiments are shown.

In the following description, same reference numerals are used for the same elements when they are depicted in different drawings. The matters defined in the description, such as detailed construction and elements, are provided to assist in a comprehensive understanding of the exemplary embodiments. However, it is apparent that the exemplary embodiments can be carried out without those specifically defined matters. Also, functions or elements known in the related art are not described in detail since they would obscure the exemplary embodiments with unnecessary detail.

The organic light emitting display apparatus according to a first exemplary embodiment will be explained below with reference to FIGS. 1 to 10.

Figure 2:
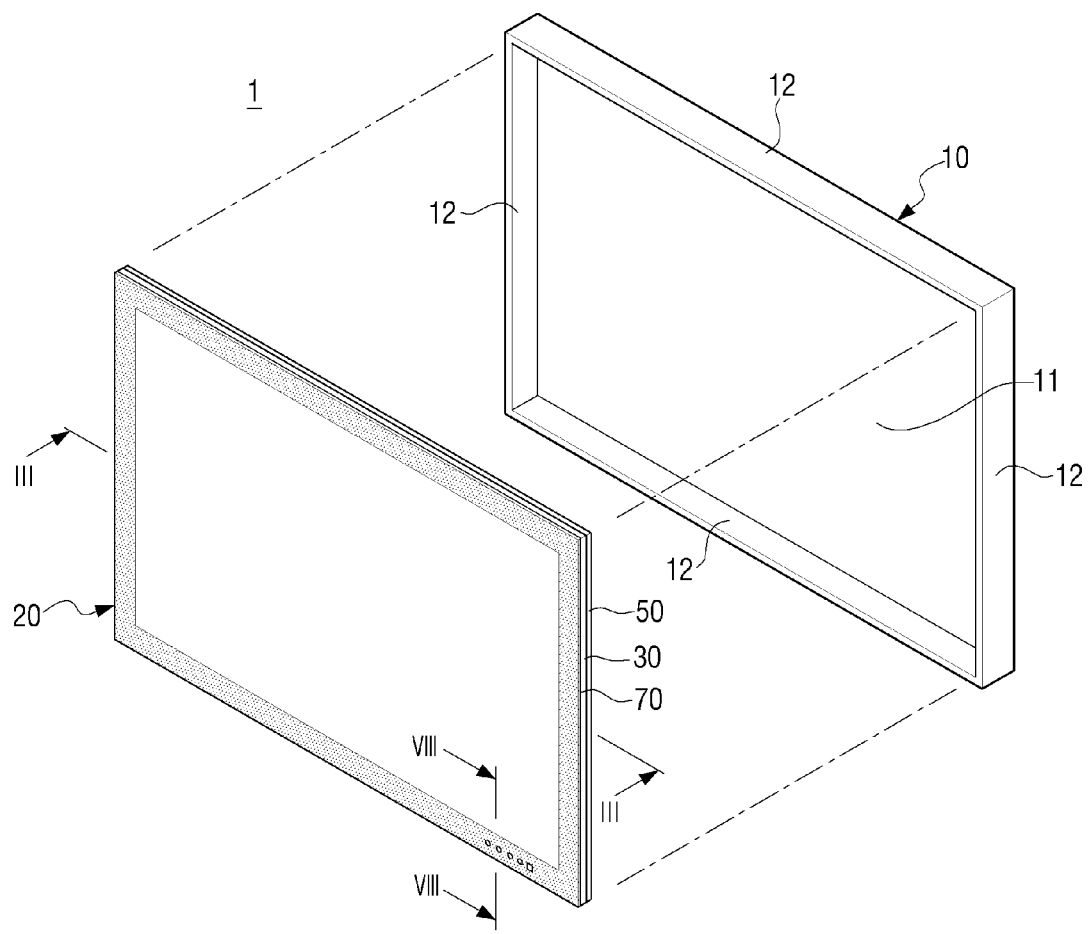
FIG. 2 is an exploded perspective view of the organic light-emitting display apparatus of FIG. 1.
Figure 3:
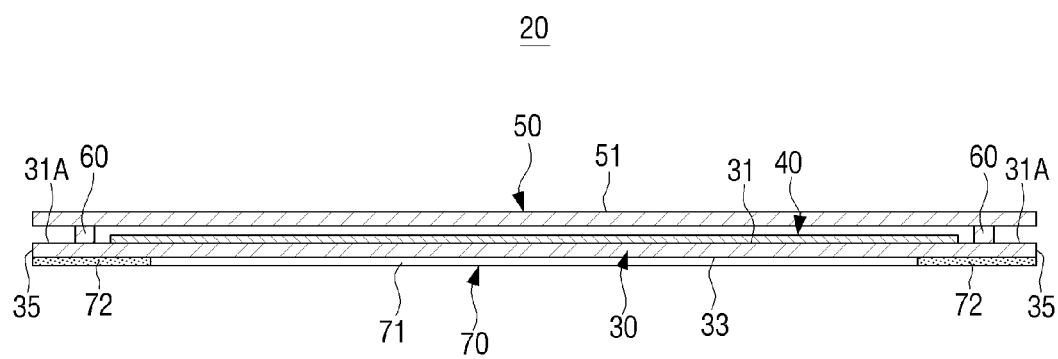
FIG. 3 is a schematic cross-section view taken on line III-III of the organic light-emitting display panel of FIG. 2.

FIG. 1 is a schematic perspective view of an organic light-emitting display apparatus according to an exemplary embodiment, FIG. 2 is an exploded perspective view of the organic light-emitting display apparatus of FIG. 1, FIG. 3 is a schematic cross-section view taken on line III-III of the organic light-emitting display panel of FIG. 2, and FIG. 4 is a cross-section view illustrating detailed structure of an image forming portion of the organic light-emitting display panel of FIG. 3.

An organic light-emitting apparatus 1 will be explained below with reference to an exemplary embodiment of a television. However, the exemplary embodiment is not limited to the above specific exemplary embodiment. Accordingly, other display apparatuses including computer monitors, for example, may also be used.

Referring to FIGS. 1 and 2, the organic light-emitting display apparatus 1 may include a rear chassis 10, and an organic light-emitting display panel 20.

The rear chassis 10 may be formed in a box-like shape which may include a rectangular bottom 11, and four sides 12 perpendicularly extended from the four edges of the rectangular bottom 11. The respective sides 12 have higher heights than the thickness of the organic light-emitting display panel 20. Accordingly, the rectangular light-emitting display panel 20 may be accommodated in the rear chassis 10. The rear chassis 10 may be made from metal with superior strength (e.g., SUS).

Although not illustrated, various boards including a control board to control the operation of the organic light-emitting display panel 20, or a power board to supply electricity to the organic light-emitting display panel may be mounted on an inner side surface of the rear chassis 10.

Figure 5:
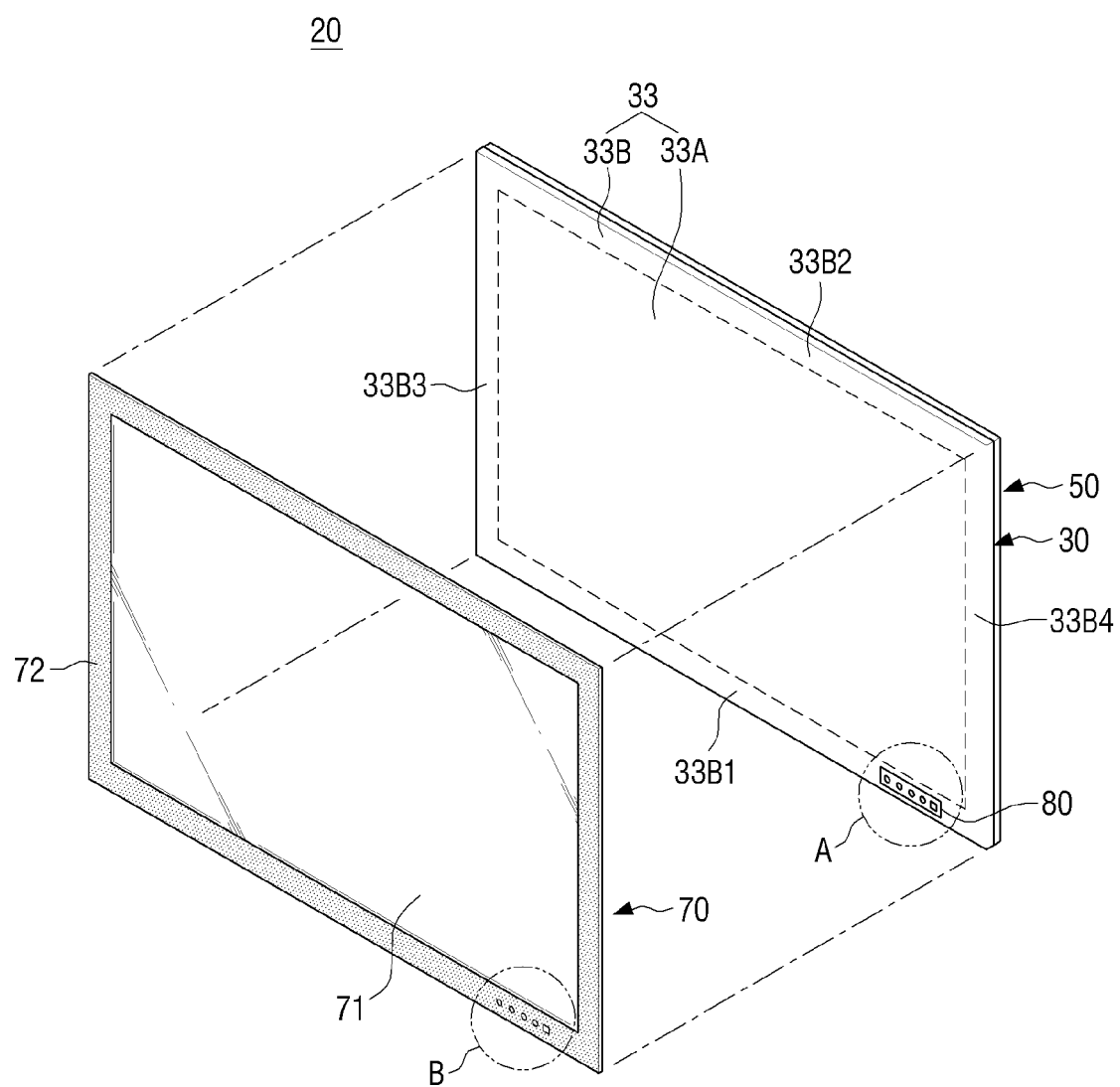
FIG. 5 is a perspective view of the organic light-emitting display panel of FIG. 2, illustrating a cover film in a separated form.

Referring to FIGS. 3 to 5, the organic light emitting display panel 20 may include a front substrate 30, an image forming portion 40, a rear substrate 50, a sealing member 60 and a cover film 70.

The front substrate 30 may be a transparent material. In an exemplary embodiment, the front substrate 30 may be made from transparent glass or transparent plastic. Thin film transistors (TFT, not illustrated) may be formed on the front substrate 30 to control pixels to display an image. Accordingly, the front substrate 30 may be also referred to as a TFT substrate.

An image may be provided over the entire area of the front substrate 30. A front surface 33 of the front substrate 30 may also be divided into an inner effective display portion 33A (see FIG. 5) where the image is provided, and a non-effective display portion 33B (see FIG. 5) where no image is provided. The non-effective display portion 33B is generally referred to as a black matrix (BM) area.

Referring to FIG. 4, an image forming portion 40 formed on a rear surface 31 of the front substrate 30 includes an anode electrode 41, a hole injecting layer (HIL) 42, a hole transporting layer (HTL) 43, an emission material layer (EML) 44, a hole blocking layer (HBL) 45, an electron transporting layer (ETL) 46, an electron injecting layer (EIL) 47, and a cathode electrode 48.

The anode and cathode electrodes 41, 48 provide holes and electrons, respectively, which are necessary to generate light, and a voltage is applied between the electrodes 41, 48 so that the holes and electrons move toward each other. In an exemplary embodiment, the anode electrode 41 may be made from inidium tin oxide (ITO), and the cathode electrode 48 may be made from aluminum.

The HIL 42, HTL 43, EML 44, HBL 45, ETL 46, and EIL 47 are organic layers made from organic compounds. Since the display panel 20 according to an exemplary embodiment may include these organic layers 42 to 48, the display panel is referred to as an organic light emitting display panel. FIG. 4 shows a stacked structure of the image forming portion 40 according to an exemplary embodiment. However, the exemplary embodiment is not limited to these structures. Instead, different stacked structures may also be used.

The holes provided by the anode electrode 41 pass the HIL 42 and the HTL 43 and reach the EML 44, and electrons provided by the cathode electrode 48 pass the EIL 47, the ETL 46, and the HBL 45, and reach the EML 44. Light is generated as the holes and electrons at the EML 44 couple with each other, and the organic light emitting display panel 20 forms an image using the light.

Since the image forming portion 40 including the electrodes 41, 48 and the organic layers 42 to 27 is well known, a detailed description thereof will be omitted for the sake of brevity.

The rear substrate 50 is arranged parallel to the front substrate 30 at a predetermined distance. The rear substrate 50 may be made from transparent or non-transparent material. In an exemplary embodiment, the rear substrate 50 may be made from glass, plastic or metal material.

The sealing member 60 may have a rectangular ring shape. The sealing member 60 may be arranged to surround the image forming portion 40 between the front and rear substrates 30, 50. The image forming portion 40 is sealed as the sealing member 60 is attached to the front and rear substrates 30, 50, respectively. Accordingly, ingress of moisture or oxygen into the image forming portion 40 is prevented.

The sealing member 60 may not be arranged on an external edge 35 of the front substrate 30, but instead, the sealing member 60 may be arranged inward at a predetermined distance from the external edge 35. If the sealing member 60 is arranged on the external edge 35 of the front substrate 30, reliability of sealingness of the image forming portion 40 may deteriorate. Accordingly, the rear surface 31 of the front substrate 30 has a non-sealed region 31A (see FIG. 3) corresponding to an area between the sealing member 60 and the external edge 35. In other words, the non-sealed region 31A refers to the area on the front surface 31A of the front substrate 30 which is not surrounded by the sealing member 60. The image forming portion 40 is not formed on the non-sealed region 31A.

The cover film 70 may be attached to the front surface 33 of the front substrate 30 to protect the front surface 33. In an exemplary embodiment, the cover film 70 may be implemented as a polarizer film.

The cover film 70 may include an inner transparent portion 71 and an outer non-transparent portion 72. The transparent portion 71 is an area corresponding to the effective display portion 33A (see FIG. 5) of the front substrate 30, which passes the image provided by the effective display portion 33A to the outside. The non-transparent portion 72 is an area corresponding to the non-effective display portion 33B (see FIG. 5) to keep the non-effective display portion 33b unexposed to the outside. For example, the non-transparent portion 72 may be provided in black color.

Figure 6:
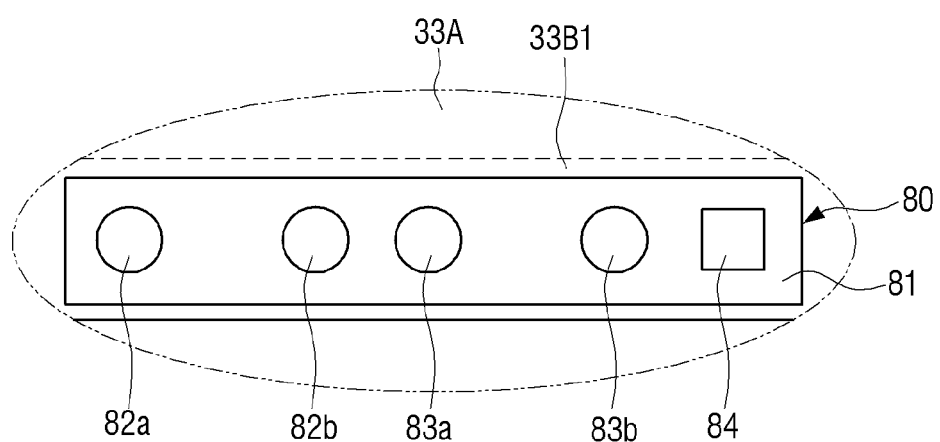
FIG. 6 is an enlarged view of area A of FIG. 5 illustrating an input key flexible printed circuit board (FPCB)
Figure 7:
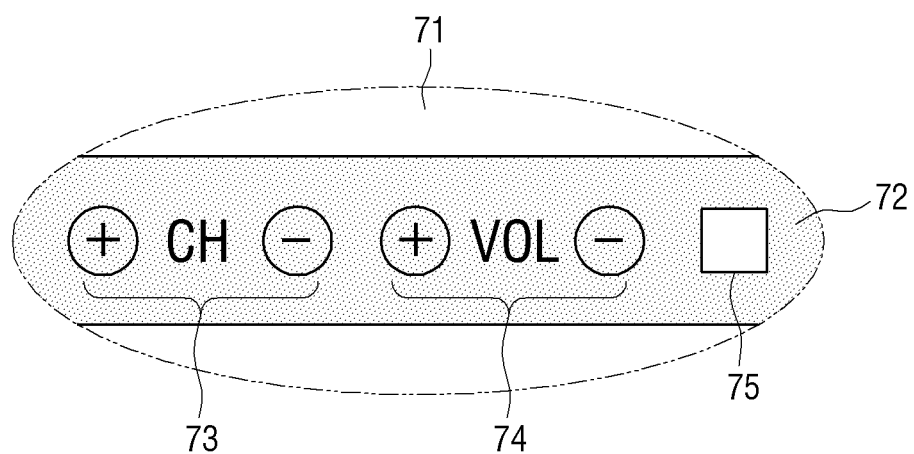
FIG. 7 is an enlarged view of area B of FIG. 5 illustrating key-location indicating marks.
Figure 8:
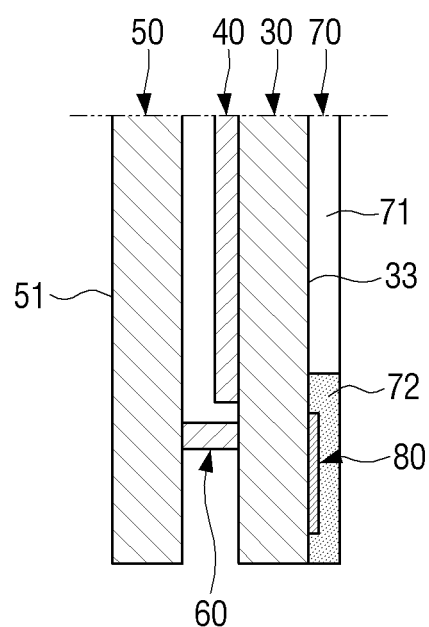
FIG. 8 is an enlarged cross-section taken on line VIII-VIII of the organic light-emitting display panel of FIG. 2.

FIG. 5 is a perspective view of the organic light-emitting display panel of FIG. 2, illustrating a cover film in a separated form, FIG. 6 is an enlarged view of area A of FIG. 5 illustrating an input key flexible printed circuit board, FIG. 7 is an enlarged view of area B of FIG. 5 illustrating key-location indicating marks, and FIG. 8 is an enlarged cross-section taken on line VIII-VIII of the organic light-emitting display panel of FIG. 2.

Referring to FIGS. 5 to 8, the organic light emitting display panel 20 additionally includes an input key FPCB 80 arranged on the front surface 33 of the front substrate 30. The input key FPCB 80 includes input elements such as input keys for screen adjustment, sound adjustment, etc. Accordingly, by manually manipulating the input keys, a user can make screen adjustment and sound adjustment, etc.

Referring to FIG. 6, the input key FPCB 80 includes a board body 81, and a plurality of input elements 82a, 82b, 83a, 83b, 84 provided on the board body 81.

The board body 81 has a rectangular form, but is not limited thereto. Accordingly, the board body 81 may have different forms such as an oval form, etc. The board body 81 is a very thin film. Further, the board body may be made from flexible polymer resin such as epoxy. In one exemplary embodiment, the board body 81 may be attached to the front substrate 30 by double coated tape or adhesive.

The input elements 82a, 82b, 83a, 83b, 84 may be provided on the board body 81 in the form of circuit patterns. First and second input keys 82a, 82b relate to channel change, third and fourth input keys 83a, 83b relate to volume adjustment, and the fifth input element 84 is an illuminance sensor. The channel change input keys 82a, 82b and the volume adjustment input keys 83a, 83b are touch sensors operating in response to a user's touch (for example, touch sensors of an electrostatic capacity type). The illuminance sensor is a photo sensor which automatically senses an illuminance of external light. Accordingly, the screen brightness can be adjusted automatically according to the luminance sensed by the illuminance sensor.

Although the embodiment depicts just five input elements 82a, 82b, 83a, 83b, 84 which are provided on the input key FPCB 80, in alternative exemplary embodiments, the input elements may be replaced or added with a screen mode change key, a brightness adjustment key, or the like.

Referring to FIG. 7, the front surface of the cover film 70 includes key location indicating marks 73, 74 and a light passing portion 75 which are provided to correspond to the input elements 82*a*, 82*b*, 83*a*, 83*b*, 84 explained above. The key location indicating marks 73, 74 and the light passing portion 75 are provided on the black non-transparent portion 72 of the cover film 70.

The key location indicating marks 73, 74 are provided to guide a user to find the locations of the channel change input keys 82*a*, 82*b* and the volume adjustment input keys 83*a*, 83*b*. For example, the user can turn down the volume by touching on the "−" mark at the key location indicated by mark 74. The light passing portion 75 is arranged at a position which corresponds to the illuminance sensor 84 so that external light can enter the illuminance sensor 84. Accordingly, the light passing portion 75 is made transparent to allow light to pass therethrough.

Referring to FIGS. 5 and 8, the input key FPCB 80 may be mounted on the non-effective display portion 33B on the front surface 33 of the front substrate 30. The input key FPCB 80 may be mounted on a lower portion 33B1 of the non-effective display portion 33B. In another exemplary embodiment, the input key FPCB 80 may also be mounted on an upper portion 33B2, a left portion 33B, or a right portion 33B4 of the non-effective display portion 33B. Further, although the input key FPCB 80 is depicted as being close to the right side of the light portion 33B1, the input key FPCB 80 may also be arranged in the center or close to the left side of the non-effective display portion 33B. In other words, the input key FPCB 80 may be mounted at any location on the non-effective display portion 33B.

Although only one input key PCB 80 is depicted in the exemplary embodiment explained above, alternative exemplary embodiments are possible. That is, in another exemplary embodiment, a plurality of input key FPCBs may be provided.

Figure 9:
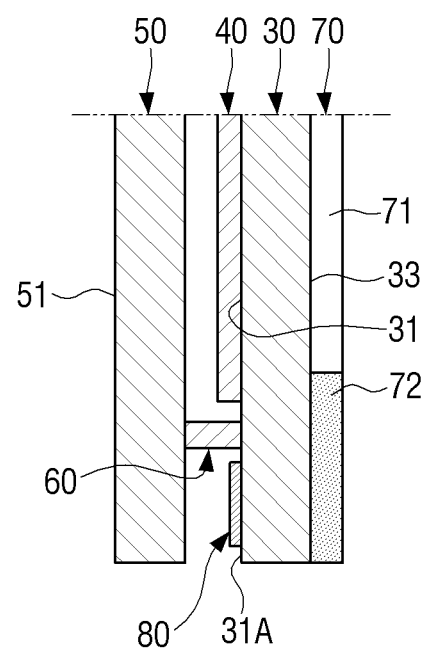
FIGS. 9 and 10 are views similar to FIG. 8, illustrating alternative mounting positions of the input key flexible printed circuit board.
Figure 10:
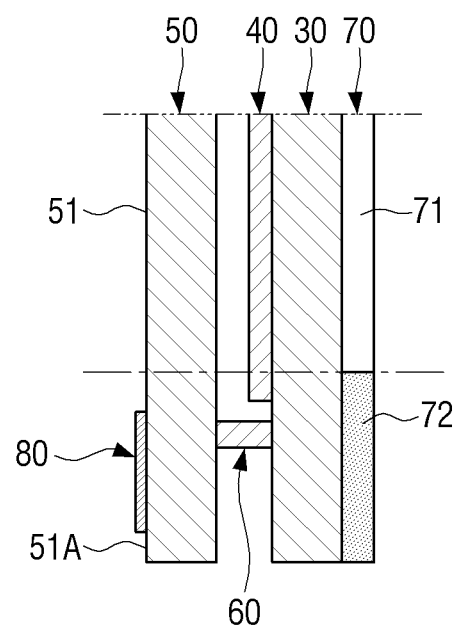

FIGS. 9 and 10 are views similar to FIG. 8, illustrating alternative mounting positions of the input key flexible printed circuit board.

Referring to FIG. 9, the input key FPCB 80 may be mounted on the rear surface 31 of the front substrate 30. In particular, the input key FPCB 80 may be mounted on the non-sealed region 31A of the rear surface 31. As explained above, the non-sealed region 31A corresponds to an area on the rear surface 31 which is not surrounded by the sealing member 60. Since the non-sealing region is formed on an upper, lower, left, or right portion of the rear surface 31, the input key FPCB 80 may not only be arranged on the lower portion of the non-sealed region 31A, but also on the upper, left, or right portions of the non-sealed region 31A.

Referring to FIG. 10, the input key FPCB 80 may be mounted on the rear surface 51 of the rear substrate 50. In this exemplary embodiment, the input key FPCB 80 may be mounted in an area 51A which corresponds to the non-effective display portion 33B (see FIG. 5) of the front substrate 30 and the non-transparent portion 72 of the cover film 70. Since the area 51A is formed on the upper, lower, left and right portions of the rear surface 51*a*, respectively, the input key FPCB 80 may not only be arranged on the lower portion, but also on the upper, left or right portions of the area 51A.

Even with the input key FPCB mounted on the rear surface 51 of the rear substrate 50, input keys of a touch sensing type may still be applied, because the organic light emitting display panel 20 is generally considerably thinner than the other types of display panels (e.g., LCD, PDP). However, the illuminance sensor 84 may not be easily implemented, considering the fact that external light can hardly reach the illuminance sensor 84 mounted on the rear surface 51 of the rear substrate 50. Even if the external light would reach the illuminance sensor 84 on the rear surface 51 of the rear substrate 50, the amount of the light reaching the illuminance sensor 84 would be insufficient, if the input key FPCB 80 is mounted on the rear surface 51 of the rear substrate 50.

As explained above, in the organic light emitting display apparatus 1 according to the first exemplary embodiment, the input key FPCB is directly mounted on the organic light emitting display panel 20. Accordingly, without requiring a front chassis, the input key PCB can be easily mounted inside the display apparatus 1. Accordingly, the display apparatus 1 may have a much simpler structure and may be more suitable for bezel-less deembleming design in comparison with a conventional design.

By attaching the input key FPCB 80 to the organic light emitting display panel 20 as described above, separate structures are not required to mount the input key PCB in the organic light emitting display apparatus 1. Since these structures to mount the input key PCB can be omitted, the organic light emitting display apparatus 1 can be manufactured at reduced costs and with slimmer structure than the structure of a conventional display apparatus. Therefore, the organic light emitting display apparatus 1 is more appropriate for the bezel-less deembleming design, i.e., a design in which the emblem is removed.

The organic light emitting display apparatus according to the second exemplary embodiment will be explained below with reference to FIGS. 11 to 17.

Figure 11:
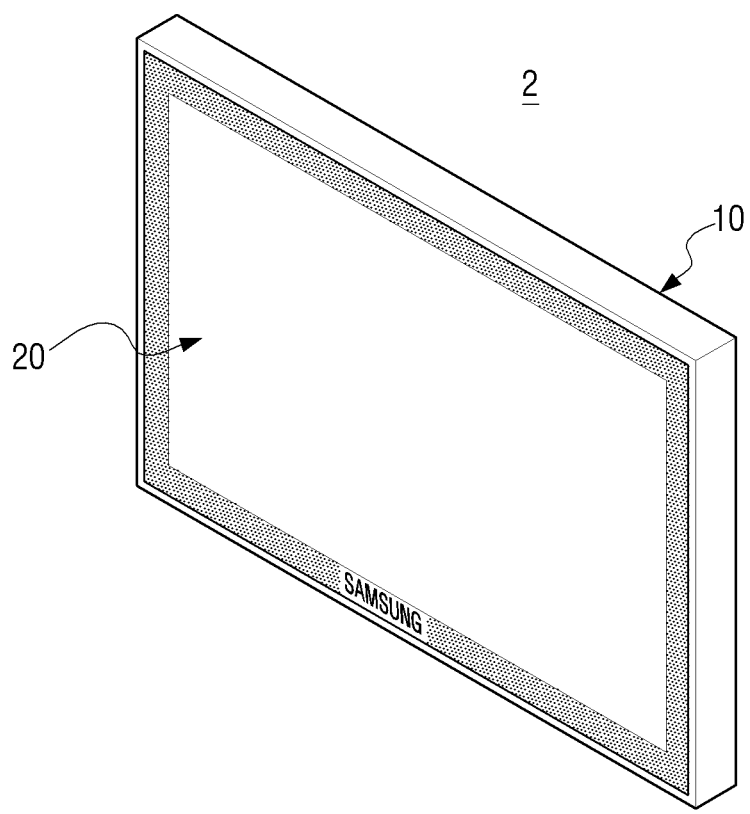
FIG. 11 is a schematic perspective view of an organic light-emitting display apparatus according to a second exemplary embodiment.
Figure 12:
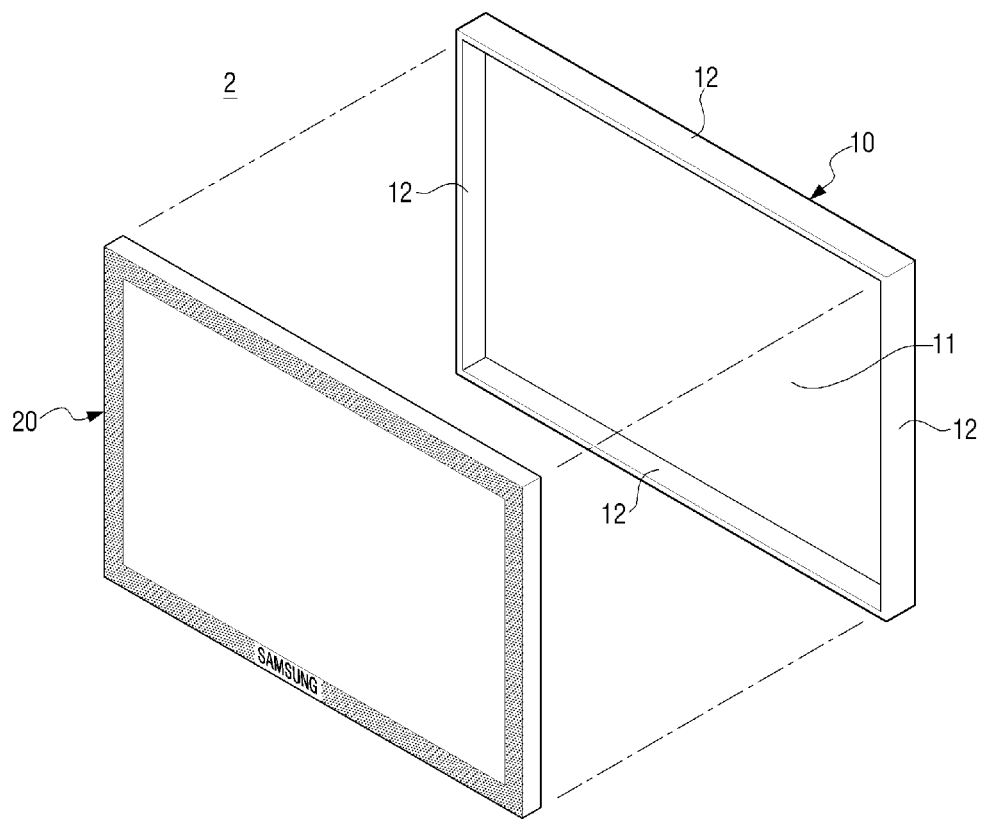
FIG. 12 is an exploded perspective view of the organic light-emitting display apparatus of FIG. 11.
Figure 13:
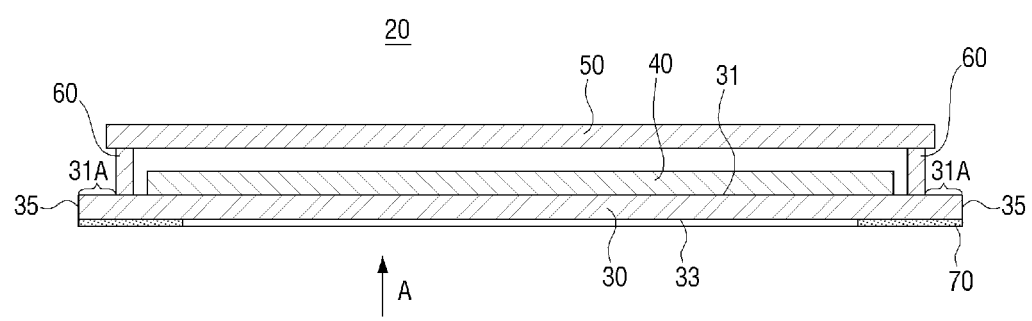
FIG. 13 is a schematic cross-section view of an organic light-emitting display panel provided in the organic light-emitting display apparatus of FIG. 11.

FIG. 11 is a schematic perspective view of an organic light-emitting display apparatus according to a second exemplary embodiment, FIG. 12 is an exploded perspective view of the organic light-emitting display apparatus of FIG. 11, FIG. 13 is a schematic cross-section view of an organic light-emitting display panel provided in the organic light-emitting display apparatus of FIG. 11, FIG. 14 is a cross-section view illustrating stacked structure of the image forming portion of the organic light-emitting display panel of FIG. 13.

Referring to FIGS. 11 and 12, the organic light emitting display apparatus 2 according to the second exemplary embodiment is illustrated as a television. However, the exemplary embodiment is not limited to the television, and other exemplary embodiments may include display apparatuses such as mobile phone displays or computer monitors.

The organic light emitting display apparatus 2 includes a rear chassis 10 and an organic light emitting display panel 20.

The rear chassis 10 is formed in a box-like shape which may include a rectangular bottom 11, and four sides 12 perpendicularly extended from the four edges of the rectangular bottom 11. The respective sides 12 have higher heights than the thickness of the organic light-emitting display panel 20. Accordingly, the rectangular light-emitting display panel 20 can be accommodated in the rear chassis 10. The rear chassis 10 may be made from metal with superior strength (e.g., SUS).

Although not illustrated, various circuit boards may be mounted on an inner side surface of a bottom 11 of the rear chassis 10 to operate the organic light emitting display panel 20. In addition, discharge members may be provided to discharge the heat generated by the organic light-emitting display panel.

Referring to FIGS. 13 and 14, the organic light emitting display panel 20 includes a front substrate 30, an image forming portion 40, a rear substrate 50, a sealing member 60 and a cover film 70.

The front substrate 30 is made of a transparent material. In an exemplary embodiment, the front substrate 30 may be made of transparent glass or transparent plastic. Thin film transistors (TFT, not illustrated) may be formed on the front substrate 30 to control the display of pixels to display an image. Accordingly, the front substrate 30 may be also referred to as a TFT substrate.

The image forming portion 40 is stacked on the rear surface 31 of the rear substrate 30. Referring to FIG. 14, the image forming portion 40 may include an anode electrode 41, a hole injecting layer (HIL) 42, a hole transporting layer (HTL) 43, an emission material layer (EML) 44, a hole blocking layer (HBL) 45, an electron transporting layer (ETL) 46, an electron injecting layer (EIL) 47, and a cathode electrode 48.

The anode and cathode electrodes 41, 48 provide holes and electrons, respectively, which are necessary to generate light, and a voltage is applied between the electrodes 41, 48 so that the holes and electrons move toward each other. In an exemplary embodiment, the anode electrode 41 may be made from inidium tin oxide (ITO), and the cathode electrode 48 may be made from aluminum.

The HIL 42, HTL 43, EML 44, HBL 45, ETL 46, and EIL 47 are organic layers made from organic compounds. Since the display panel 20 according to an exemplary embodiment includes these organic layers 42 to 48, the display panel is referred to as an organic light emitting display panel. FIG. 14 shows a layered structure of the image forming portion 40 according to an exemplary embodiment. However, the image forming portion 40 is not limited to this structure.

The holes provided by the anode electrode 41 pass the HIL 42 and the HTL 43 and reach the EML 44, and electrons provided by the cathode electrode 48 pass the EIL 47, the ETL 46, and the HBL 45, and reach the EML 44. Light is generated as the holes and electrons at the EML 44 couple with each other, and the organic light emitting display panel 20 forms an image using the light.

Since the image forming portion 40 including the electrodes 41, 48 and the organic layers 42 to 27 is well known, detailed description thereof will be omitted for the sake of brevity.

The rear substrate 50 has a rectangular plate shape which is slightly smaller than the front substrate 30, and is arranged parallel to the front substrate 30 at a predetermined distance. The rear substrate 50 may be made from transparent or non-transparent material. In an exemplary embodiment, like the front substrate 30, the rear substrate 50 may be made from glass or plastic material.

The sealing member 60 has a rectangular ring shape and is interposed between the front and rear substrates 30, 50. The image forming portion 40 is sealed as the sealing member 60 is attached to the front and rear substrates 30, 50, respectively. Accordingly, ingress of moisture or oxygen into the image forming portion 40 is prevented.

Referring to FIG. 13, the sealing member 60 is not arranged on an external edge 35 of the front substrate 30, but instead, the sealing member may be arranged inward at a predetermined distance from the external edge 35. If the sealing member 60 is arranged on the external edge 35 of the front substrate 30, reliability of sealingness of the image forming portion 40 may deteriorate. Accordingly, the rear surface 31 of the front substrate 30 has a non-sealed region 31A corresponding to an area between the sealing member 60 and the external edge 35. In other words, the non-sealed region 31A refers to the area on the rear surface 31 of the front substrate 30 which is not surrounded by the sealing member 60. The image forming portion 40 is not stacked on the non-sealed region 31A.

The cover film 70 is attached to the front surface 33 of the front substrate 30 to cover the front surface 33. In an exemplary embodiment, the cover film 70 may be implemented as a polarizer film. The cover film 70 may be transparent at least at a portion corresponding to the effective display portion of the organic light emitting display panel 20. The effective display portion is defined as a predetermined area of the organic light emitting display panel 20 on which an image may actually appear when the organic light emitting display panel 20 is viewed from a front direction (i.e., from an A direction). The non-effective display portion is defined as a predetermined area of the organic light emitting display panel 20 on which the image does not appear when the organic light emitting display panel 20 is viewed from the front direction (i.e., from the A direction).

Figure 15:
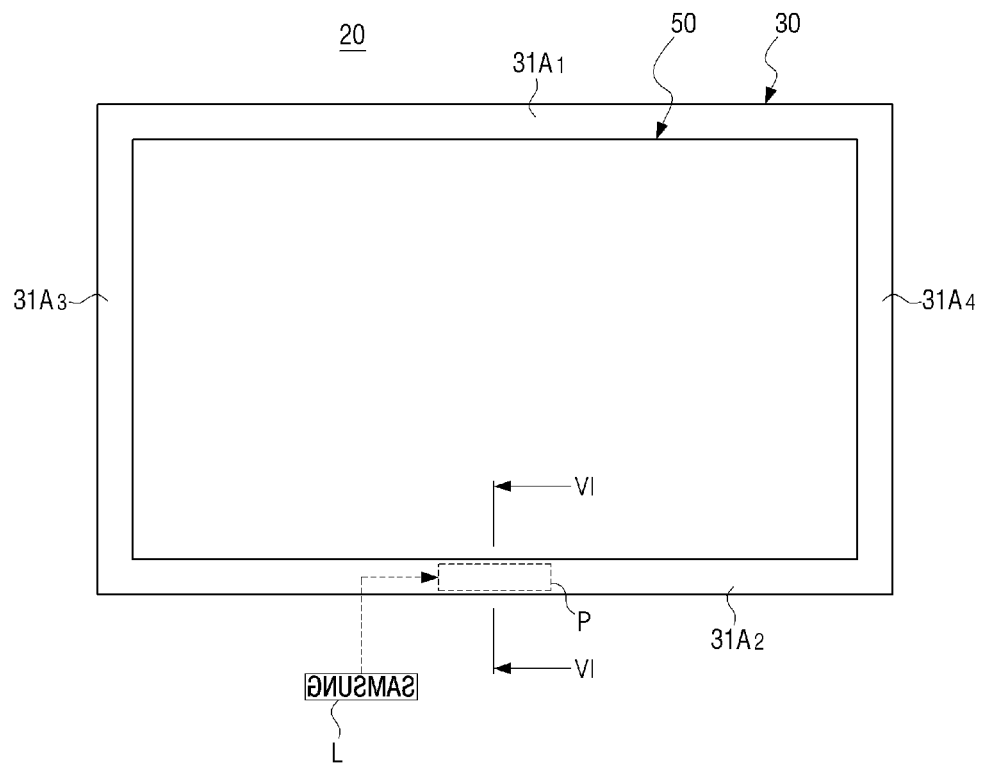
FIG. 15 is a plan view illustrating the organic light-emitting display panel of FIG. 13 from a rear direction.
Figure 16:
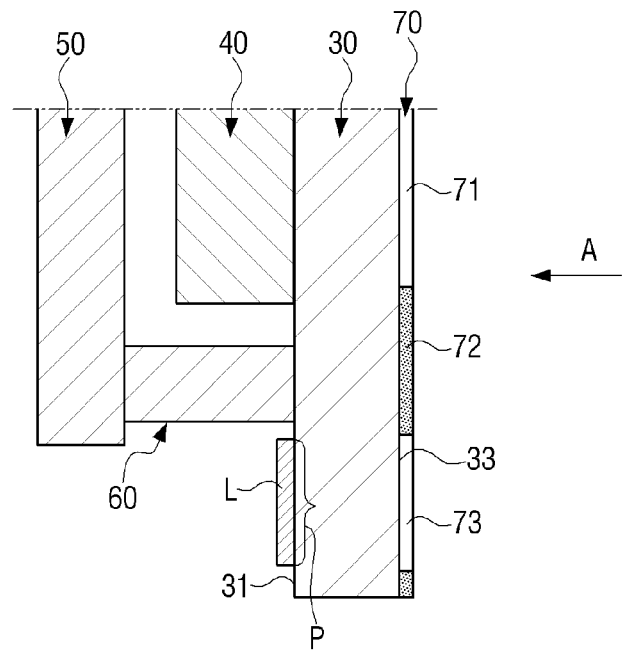
FIG. 16 is a partially-enlarged cross-section view taken on line VI-VI of FIG. 15.

FIG. 15 is a plan view illustrating the organic light-emitting display panel of FIG. 13 from rear direction, and FIG. 16 is a partially-enlarged cross-section view taken on line VI-VI of FIG. 15.

Referring to FIG. 15, when the organic light emitting display panel 20 is viewed from a rear direction, the non-sealed region 31A of the front substrate 30 includes an upper non-sealed portion 31A1, a lower non-sealed portion 31A2, a left non-sealed portion 31A3, and a right non-sealed portion 31A4. At least one of these non-sealed portions 31A1, 31A2, 31A3, 31A4 includes a see-through region P which can be seen through from the outside. In one exemplary embodiment, the see-through region P is formed on the lower non-sealed region 31A2. Also in one exemplary embodiment, the see-through region P is of a rectangular form. However, the form of the see-through region P is not limited thereto. Accordingly, the see-through region P may be of a circular form, an oval form, or another form or shape.

Referring to FIG. 15, an emblem L in the form of a sticker is attached in the see-through region P. The emblem L may include a logo representing a manufacturer or a product. Any format or expression may be used, such as including letters, symbols, or drawings. The emblem L may be used not only for the purpose of promotional activity, but also to increase aesthetic aspects of the product. In alternative exemplary embodiments, the emblem L may not be attached in the see-through region P, but may be formed thereon by embossing or engraving followed by coloring or coating.

Referring to FIG. 16, the cover film attached onto the front surface of the front substrate 30 includes a transparent portion 71 and a non-transparent portion 72.

The transparent portion 71 is an area corresponding to an effective display portion (not illustrated) of the organic light emitting display panel 20. A user is thus able to view an image formed by the organic light emitting display panel 20 through the transparent portion 71.

The non-transparent portion 72 is an area provided to opaquely block the non-effective display portion (not illustrated) of the organic light emitting display panel 20. In an exemplary embodiment, the non-transparent portion 72 may be provided in black color. The non-transparent portion 70 may be also formed in rectangular frame shape, and may surround the transparent portion 71. As explained above, in one exemplary embodiment, since the non-transparent portion 72 of the cover film 70 blocks the non-effective display portion, a bezel, which is generally required for the conventional displays, is not required. That is, the non-transparent portion 72 of the cover film 70 can replace the bezel.

The light passing portion 73 is provided to provide visibility of the see-through region P from the outside of the organic light emitting display panel 20 in a direction of viewing (i.e., in the A direction). Accordingly, the light passing portion 73 may have a corresponding location, a shape and a size as the transparent region P. Accordingly, the emblem L provided in the see-through region P on the rear surface 31 of the front substrate 30 can be seen from the outside through the light passing portion 73 of the cover film 70 (see FIG. 11).

As explained above, the exemplary embodiment provides an advantage of omitting a need for a conventional bezel, because the cover film 70 replaces the bezel. Further, since the externally-viewable emblem L is provided on the rear surface 31 of the front substrate 30, not only the aesthetic feeling of the display panel is improved, but also a minimized size of the display panel in terms of space utilization is provided.

Figure 17:
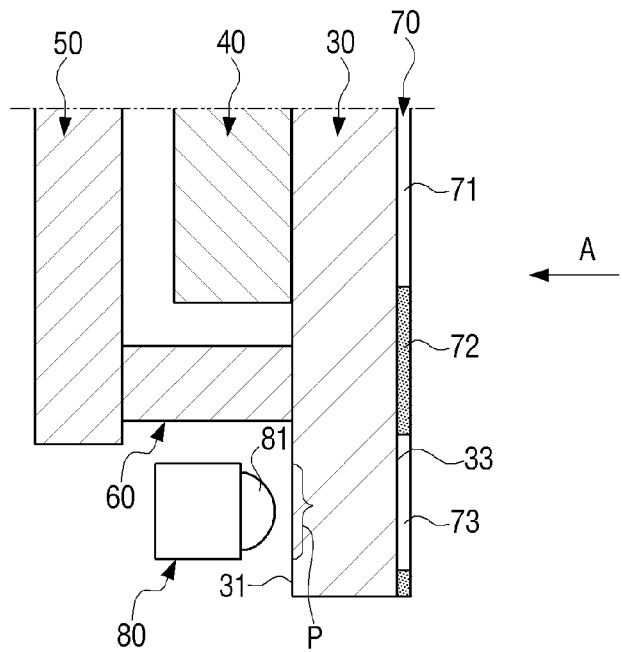
FIG. 17 is a cross-section view similar to FIG. 16, illustrating an alternative exemplary embodiment of a projection area provided on a rear surface of a front substrate.

FIG. 17 is a cross-section view similar to FIG. 16, illustrating an alternative exemplary embodiment of a projection area provided on a rear surface of a front substrate.

Referring to FIG. 17, the organic light emitting apparatus 2 further includes an embedded camera module 80. The camera module 80 includes a lens unit 81 arranged adjacent to and opposed to the see-through region P. As a result, the light emitted from an object passes the light passing portion 73 of the cover film 70 and the see-through region P of the front substrate 30 and enters the lens unit 81.

According to an exemplary embodiment illustrated in FIG. 17, the camera module 80 photographs through the see-through region P of the front substrate 30. Accordingly, since space for arranging camera module 80 can be saved in the organic light emitting display apparatus 2, more compact-size display can be provided.

Although only one see-through region P (FIG. 15) is depicted as being formed on the front substrate 30, other exemplary embodiments are possible. Accordingly, it will be appreciated that there can be a plurality of see-through regions P formed on the non-sealed region 31A of the front substrate 30, with also accordingly increasing the number of light passing portions 73 of the cover film 70 to enable visibility of the see-through regions P.

Although an exemplary embodiment has been illustrated with reference to the exemplary embodiments of the organic light emitting apparatuses 1, 2 implemented as a television, the exemplary embodiments are also applicable to other types of displays other than television (e.g., computer monitor, various IT electronic devices, etc.) to which organic light emitting display panels are applicable.

The foregoing exemplary embodiments and advantages are merely exemplary and are not to be construed as limiting the present inventive concept. The exemplary embodiments can be readily applied to other types of apparatuses. The description of the exemplary embodiments is intended to be illustrative, and not to limit the scope of the claims, and many alternatives, modifications, and variations will be apparent to those skilled in the art.

What is claimed is:

1. A display apparatus comprising an organic light emitting display panel, the organic light emitting display panel comprising:
    a front substrate and a rear substrate arranged parallel to each other;
    an image forming portion which is formed on a rear surface of the front substrate and which comprises at least one organic layer;
    a sealing member which surrounds the image forming portion between the front substrate and the rear substrate to seal the image forming portion; and
    an input key flexible printed circuit board comprising input elements,
    wherein an entire board body of the input key flexible printed circuit board is mounted by a double coated tape or adhesive on the front substrate or on the rear substrate.

2. The display apparatus of claim 1, wherein the organic light emitting display panel further comprises a cover film to cover a front surface of the front substrate, and
    wherein the cover film comprises
        a transparent portion corresponding to an effective display portion of the front substrate, and
        a non-transparent portion corresponding to a non-effective display portion of the front substrate.

3. The display apparatus of claim 2, wherein the input key flexible printed circuit board is mounted on the front surface of the front substrate.

4. The display apparatus of claim 3, wherein the input key flexible printed circuit board is arranged on the non-effective display portion of the front substrate and is covered by the non-transparent portion of the cover film.

5. The display apparatus of claim 4, wherein at least one of the input elements comprises an illuminance sensor to automatically adjust brightness of an image in accordance with an ambient intensity of illumination, and
    wherein the non-transparent portion of the cover film comprises a light passing portion for reception of an external light by the illuminance sensor.

6. The display apparatus of claim 2, wherein the input key flexible printed circuit board is mounted on the rear surface of the front substrate.

7. The display apparatus of claim 6, wherein the rear surface of the front substrate comprises a non-sealed region un-surrounded by the sealing member, and
    wherein the input key flexible printed circuit board is mounted on the non-sealed region.

8. The display apparatus of claim 7, wherein at least one of the input elements comprises an illuminance sensor to automatically adjust brightness of an image in accordance with ambient intensity of illumination,
    wherein the front substrate is made of a transparent material, and
    wherein the non-transparent portion of the cover film comprises a light passing portion for reception of an external light by the illuminance sensor.

9. The display apparatus of claim 1, wherein the input key flexible printed circuit board is mounted on the rear surface of the front substrate.

10. The display apparatus of claim 9, wherein the input key flexible printed circuit board is mounted on the rear surface of the rear substrate corresponding to a non-effective display portion of the front substrate.

11. The display apparatus of claim 1, wherein at least one of the input elements comprises a touch sensor responsive to a touch made by a user.

12. The display apparatus of claim 11, wherein the touch sensor comprises a touch sensor of an electrostatic capacity type.

13. The display apparatus of claim 2, wherein the rear surface of the front substrate comprises a non-sealed region un-surrounded by the sealing member, and
    wherein the non-sealed portion comprises at least one see-through region which can be seen through from an outside through the cover film.

14. The display apparatus of claim 13, wherein the non-transparent portion of the cover film comprises at least one light passing portion corresponding to the at least one see-through region.

15. The display apparatus of claim 14, wherein the see-through region is provided with at least one emblem for the purpose of promotion or aesthetic feeling.

16. The display apparatus of claim 15, wherein the emblem is a product logo.

17. The display apparatus of claim 15, wherein the emblem is attached in the see-through region in a sticker form.

18. The display apparatus of claim 15, wherein the emblem is formed in the see-through region by embossing or engraving followed by coating or coloring.

19. The display apparatus of claim 14, wherein the display apparatus further comprises an embedded camera module, and wherein the camera module comprises a lens unit arranged to face the see-through region.

20. A display apparatus comprising an organic light emitting display panel, the organic light emitting display panel comprising:

a front substrate and a rear substrate arranged parallel to each other;

an image forming portion which is formed on a rear surface of the front substrate and which comprises at least one organic layer;

a sealing member which surrounds the image forming portion between the front substrate and the rear substrate to seal the image forming portion; and a cover film attached to the front surface of the front substrate, wherein the cover film comprises a transparent portion corresponding to an effective display portion of the front substrate and a non-transparent portion corresponding to a non-effective display portion of the front substrate, wherein the rear surface of the front substrate comprises a non-sealed region un-surrounded by the sealing member, and wherein the non-sealed region comprises at least one see-through region which can be seen through from an outside through a light passing portion of the non-transparent portion of the cover film.

21. The display apparatus of claim 20, wherein the see-through region is provided with at least one emblem for the purpose of promotion or aesthetic feeling.

22. The display apparatus of claim 21, wherein the emblem is a product logo.

23. The display apparatus of claim 20, wherein the display apparatus further comprises an embedded camera module, and wherein the camera module comprises a lens unit arranged to face the see-through region.

* * * * *